US011432420B2

(12) United States Patent
Huang et al.

(10) Patent No.: US 11,432,420 B2
(45) Date of Patent: Aug. 30, 2022

(54) ELECTRONIC DEVICE AND INSULATING PIECE THEREOF

(71) Applicant: DELTA ELECTRONICS, INC., Taoyuan (TW)

(72) Inventors: Chia-Hsiong Huang, Taoyuan (TW); Wen-Chuan Lo, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 40 days.

(21) Appl. No.: 17/153,857

(22) Filed: Jan. 20, 2021

(65) Prior Publication Data

US 2021/0378116 A1 Dec. 2, 2021

(30) Foreign Application Priority Data

May 27, 2020 (CN) .......................... 202010462493.6

(51) Int. Cl.
*H05K 5/02* (2006.01)

(52) U.S. Cl.
CPC ......... *H05K 5/0247* (2013.01); *H05K 5/0221* (2013.01)

(58) Field of Classification Search
None
See application file for complete search history.

(56) References Cited

U.S. PATENT DOCUMENTS

| 7,033,208 B1* | 4/2006 | Huang | H01R 12/774 |
| | | | 439/498 |
| 10,374,355 B2* | 8/2019 | Ayzenberg | G02B 6/4261 |
| 2013/0337671 A1* | 12/2013 | Tsang | H01R 13/6275 |
| | | | 439/159 |
| 2015/0263330 A1* | 9/2015 | Seo | H01M 50/578 |
| | | | 429/7 |

FOREIGN PATENT DOCUMENTS

CN 203103376 U 7/2013

* cited by examiner

*Primary Examiner* — Xanthia C Cunningham
(74) *Attorney, Agent, or Firm* — CKC & Partners Co., LLC

(57) ABSTRACT

An insulating piece for an electronic device is provided. The electronic device includes a first housing component and a second housing component. The first housing component includes at least one hook portion connected to the second housing component. The insulating piece includes a first covering portion, a second covering portion and at least one concave structure. The first and second covering portions extend in different directions. The concave structure is connected between the first and second covering portions. The concave structure and the second housing component form an accommodating space therebetween to accommodate the hook portion. The first and second covering portions cover inner sides of the first and second housing components respectively.

10 Claims, 5 Drawing Sheets

ELECTRONIC DEVICE AND INSULATING PIECE THEREOF

RELATED APPLICATIONS

This application claims priority to China Application Serial Number 202010462493.6, filed May 27, 2020, the disclosure of which is incorporated herein by reference in its entirety.

BACKGROUND

Technical Field

The present disclosure relates to an electronic device and an insulating piece thereof.

Description of Related Art

Some electronic apparatuses are equipped with insulation members. These apparatuses are frequently troubled with the rupturing of insulation member, which results from the casing interfering with the insulation member in the assembly process. The insulation member, when ruptured, can no longer provide suitable electrical insulation for the apparatus.

SUMMARY

In view of the foregoing, one of the objects of the present disclosure is to provide a novel electronic device to resolve the aforementioned problem.

To achieve the objective stated above, in accordance with an embodiment of the present disclosure, an insulating piece for an electronic device includes a first covering portion, a second covering portion and at least one concave structure. The electronic device includes a first housing component and a second housing component. The first housing component includes at least one hook portion connected to the second housing component. The first covering portion and the second covering portion extend in different directions. The concave structure is connected between the first covering portion and the second covering portion. The concave structure and the second housing component form an accommodating space therebetween to accommodate the hook portion. The first covering portion and the second covering portion cover inner sides of the first housing component and the second housing component respectively.

In one or more embodiments of the present disclosure, the concave structure includes an arc connected between the first covering portion and the second covering portion.

In one or more embodiments of the present disclosure, the arc has a radius of curvature substantially matching a length by which the hook portion extends into the accommodating space.

In one or more embodiments of the present disclosure, the at least one concave structure and the at least one hook portion are both plural in number. The concave structures are spaced apart from one another and are positioned correspondent to the hook portions. The first covering portion joins the second covering portion between two of the concave structures to form a corner structure.

In one or more embodiments of the present disclosure, the concave structure has two opposite ends, both of which are rounded.

In one or more embodiments of the present disclosure, the second housing component has at least one retaining slot. The hook portion slidably engages the retaining slot. The hook portion has a cutout configured to interlock with an end of the retaining slot. The concave structure is positioned correspondent to the hook portion and the retaining slot.

In one or more embodiments of the present disclosure, the second housing component has at least one retaining slot. The retaining slot includes an insertion portion and a holding portion in communication with the insertion portion. The insertion portion is greater in width than the holding portion. The hook portion is configured to enter the retaining slot through the insertion portion and rotate to interlock with the holding portion. The concave structure is positioned correspondent to the hook portion and the retaining slot.

In one or more embodiments of the present disclosure, the concave structure includes a first extending portion and a second extending portion. The second extending portion is connected to the first extending portion and is substantially perpendicular to the first extending portion.

In one or more embodiments of the present disclosure, the concave structure includes an incline connected between the first covering portion and the second covering portion.

In accordance with an embodiment of the present disclosure, an electronic device includes an insulating piece, a first housing component and a second housing component. The insulating piece includes a concave structure, a first covering portion and a second covering portion. The first covering portion and the second covering portion extend in different directions. The concave structure is connected between the first covering portion and the second covering portion. The first housing component includes a hook portion. The second housing component has a retaining slot for receiving the hook portion. The first covering portion and the second covering portion cover inner sides of the first housing component and the second housing component respectively. The concave structure and the second housing component form an accommodating space therebetween to accommodate the hook portion.

In sum, the insulating piece of the present disclosure is provided with a concave structure which forms an accommodating space with the housing to accommodate the hook portion of the housing. By this arrangement, the insulating piece may be clear of being interfered by the hook portion when assembling the housing, and can thus remain intact.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
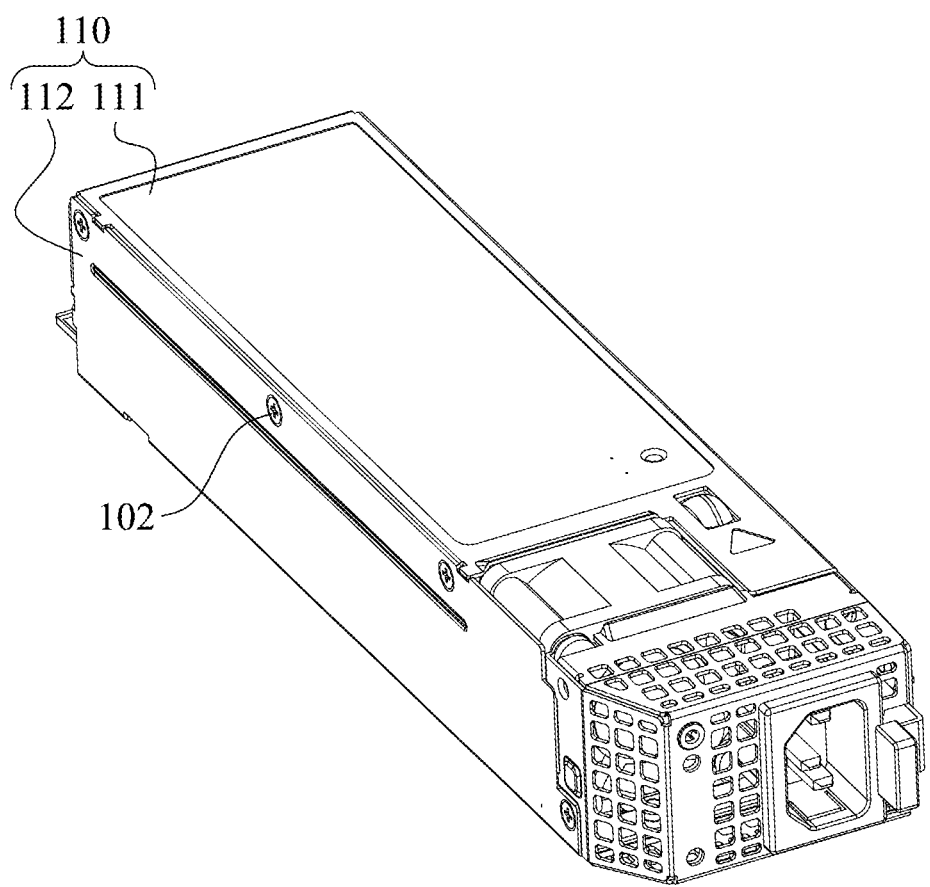
FIG. 1 illustrates an assembled view of an electronic device in accordance with an embodiment of the present disclosure.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Figure 2:
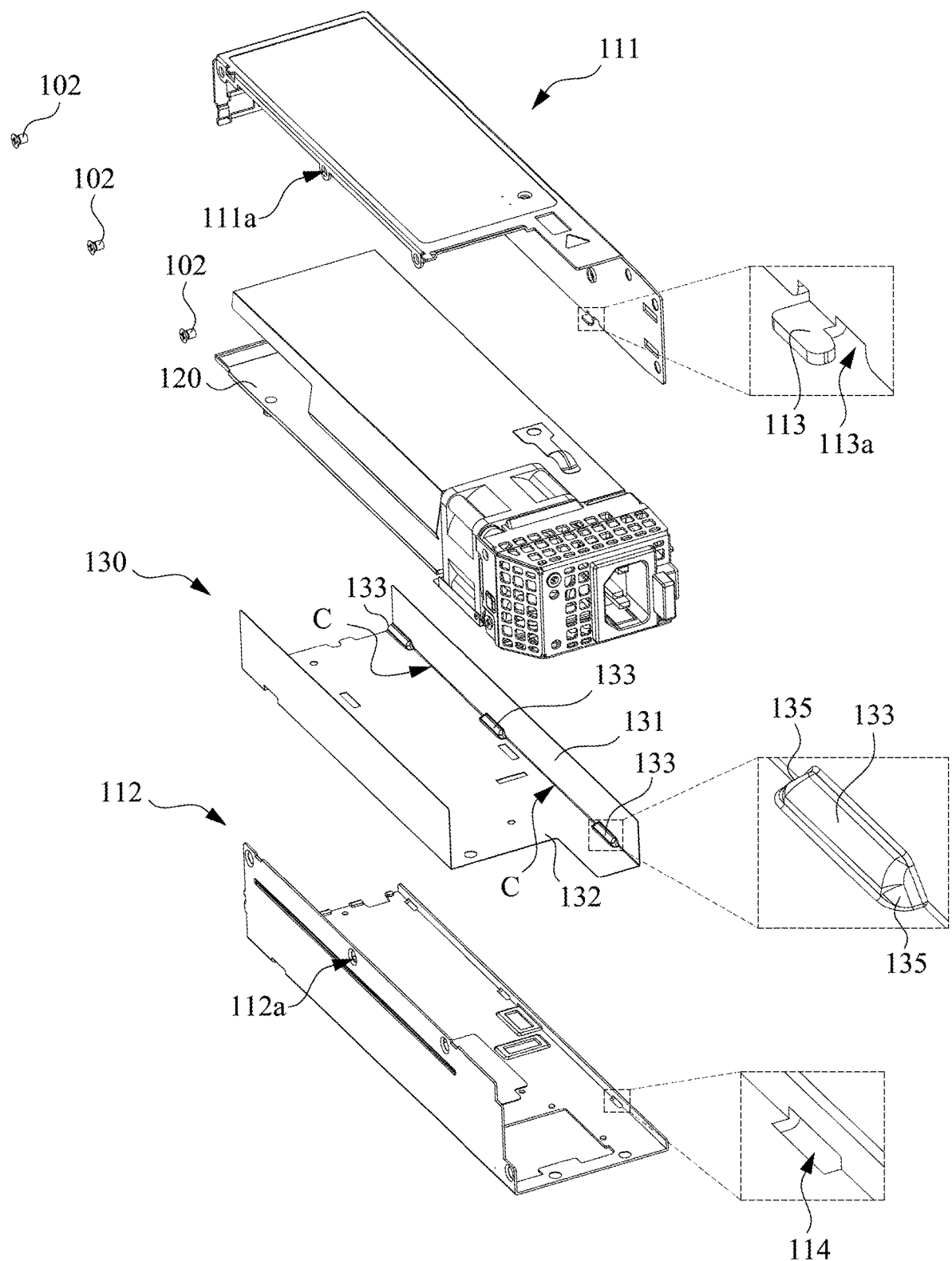
FIG. 2 illustrates an exploded view of the electronic device shown in FIG. 1.

Reference is made to FIGS. 1 and 2. FIG. 1 illustrates an assembled view of an electronic device 100 in accordance with an embodiment of the present disclosure. FIG. 2 illustrates an exploded view of the electronic device 100 shown in FIG. 1. The electronic device 100 includes a housing 110, an electronic component 120 and an insulating piece 130. The electronic component 120 and the insulating piece 130 are both accommodated in the housing 110. The housing 110 may be, for example, a metallic housing. The insulating piece 130 (e.g., an angled insulating sheet) is disposed between the housing 110 and the electronic component 120 for the purpose of electrical insulation between the two. In some embodiments, the electronic device 100 is a power supply unit (PSU), and the electronic component 120 includes a circuit board and elements/circuits thereon.

As shown in FIGS. 1 and 2, the housing 110 includes a first housing component 111 and a second housing component 112. The first housing component 111 includes at least one hook portion 113. The second housing component 112 has at least one retaining slot 114 for receiving the hook portion 113, such that the hook portion 113 is connected to the second housing component 112. The first housing component 111 and the second housing component 112 are combined to form the housing 110 by virtue of the engagement of the hook portion 113 and the retaining slot 114. The insulating piece 130 is disposed on inner sides of the first housing component 111 and the second housing component 112, and partially covers the electronic component 120.

As shown in FIGS. 1 and 2, in some embodiments, the first housing component 111 has a plurality of first fixing holes 111a. The first fixing holes 111a are arranged on an edge of the first housing component 111 away from the hook portion 113. The second housing component 112 has a plurality of second fixing holes 112a. The second fixing holes 112a are arranged on an edge of the second housing component 112 away from the retaining slot 114, and are configured to overlap with respective first fixing holes 111a. The electronic device 100 further includes a plurality of fasteners 102 (exemplified as screws in FIGS. 1 and 2). The fasteners 102 pass through respective first and second fixing holes 111a and 112a to fixedly combine and the first housing component 111 and the second housing component 112.

As shown in FIGS. 1 and 2, the insulating piece 130 includes a first covering portion 131, a second covering portion 132 and at least one concave structure 133. The first covering portion 131 and the second covering portion 132 extend in different directions (i.e., the first covering portion 131 is at an angle to the second covering portion 132; in the illustrated embodiment, the first covering portion 131 is normal to the second covering portion 132), and the first covering portion 131 and the second covering portion 132 cover inner sides of the first housing component 111 and the second housing component 112 respectively.

Figure 3:
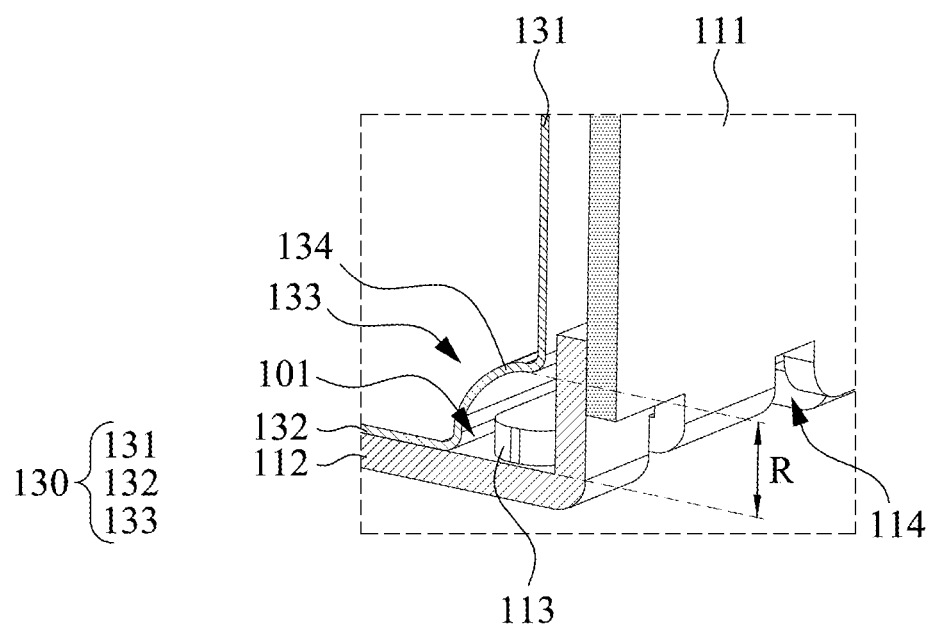
FIGS. 3 and 4 illustrate partially enlarged cross-sectional views of the housing and the insulating piece of the electronic device shown in FIG. 1, before and after the housing is assembled.

Further referring to FIG. 3, the concave structure 133 is connected between the first covering portion 131 and the second covering portion 132. The concave structure 133 and the second housing component 112 form an accommodating space 101 therebetween to accommodate the hook portion 113. By this arrangement, the insulating piece 130 may be clear of being interfered by the hook portion 113 when assembling the housing 110, and can thus remain intact to provide proper electrical insulation between the housing 110 and the electronic component 120.

As shown in FIGS. 2 and 3, in some embodiments, the concave structure 133 includes an arc 134. The arc 134 is connected between the first covering portion 131 and the second covering portion 132, and a concave surface of the arc 134 faces towards the hook portion 113 and the retaining slot 114. The accommodating space 101, which is formed between the arc 134 and the second housing component 112, has a cross-section that is a quarter circular disk. In some embodiments, the arc 134 has a radius of curvature R substantially matching a length by which the hook portion 113 extends into the accommodating space 101.

As shown in FIGS. 2 and 3, in some embodiments, the first housing component 111 includes a plurality of hook portions 113 and the second housing component 112 includes a plurality of retaining slots 114. The insulating piece 130 includes a plurality of concave structures 133 that are spaced apart from one another and are positioned correspondent to the hook portions 113 and the retaining slots 114. The first covering portion 131 joins the second covering portion 132 between two of the concave structures 133 to form a corner structure C. By this arrangement, the space occupied by the insulating piece 130 may be reduced, thereby increasing the space inside the housing 110 available for mounting electronic component(s).

As shown in FIGS. 2 and 3, in some embodiments, the concave structure 133 has two opposite ends 135, both of which are rounded to further lower the likelihood of the rupturing of the insulating piece 130.

As shown in FIGS. 2 and 3, in some embodiments, the hook portion 113 slidably engages the retaining slot 114, and the hook portion 113 has a cutout 113a configured to interlock with an end of the retaining slot 114.

Figure 4:
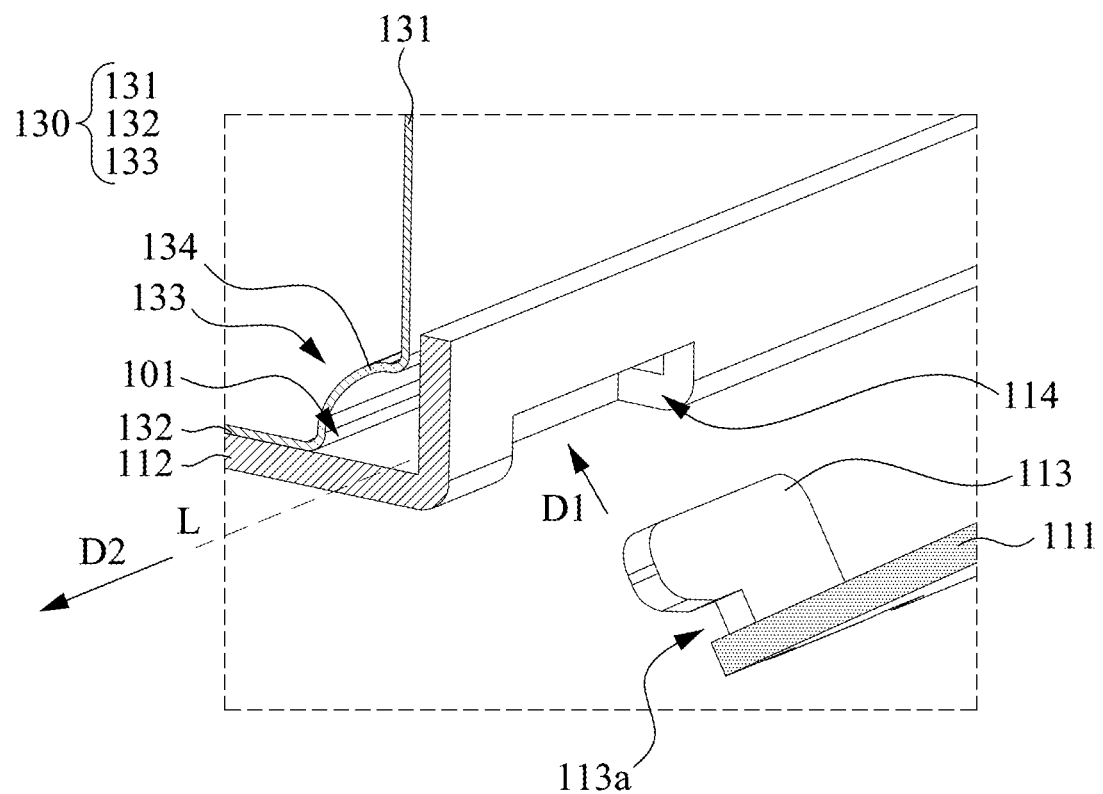

Reference is made to FIGS. 3 and 4. To assemble the housing 110, one may move the first housing component 111 in a direction D1 to insert the hook portion 113 into the accommodating space 101 through the retaining slot 114, and then rotate the first housing component 111 about an axis L, until the inner surface of the first housing component 111 abuts against the second housing component 112. Next, one may move the first housing component 111 in a direction D2, such that the hook portion 113 slides in the accommodating space 111, until the cutout 113a of the hook portion 113 interlocks with an end of the retaining slot 114 to fixedly connect the first housing component 111 to the second housing component 112. In some embodiments, after the steps described above, the fasteners 102 (see, e.g., FIG. 2) may be utilized to combine the first housing component 111 and the second housing component 112 to complete the assembly of the housing 110.

Figure 5:
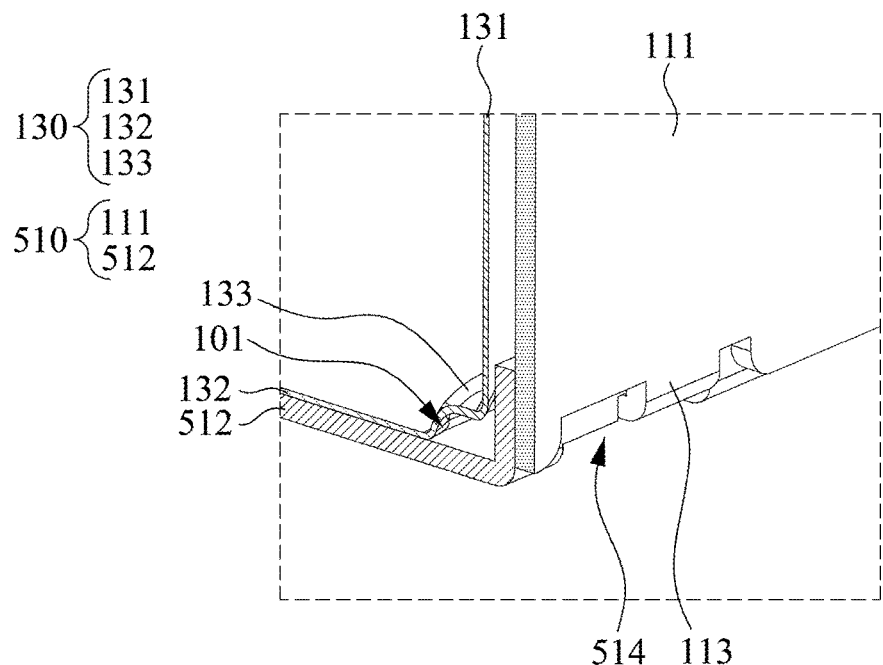
FIGS. 5 and 6 illustrate partially enlarged cross-sectional views of an electronic device in accordance with another embodiment of the present disclosure, before and after the housing of the electronic device is assembled.
Figure 6:
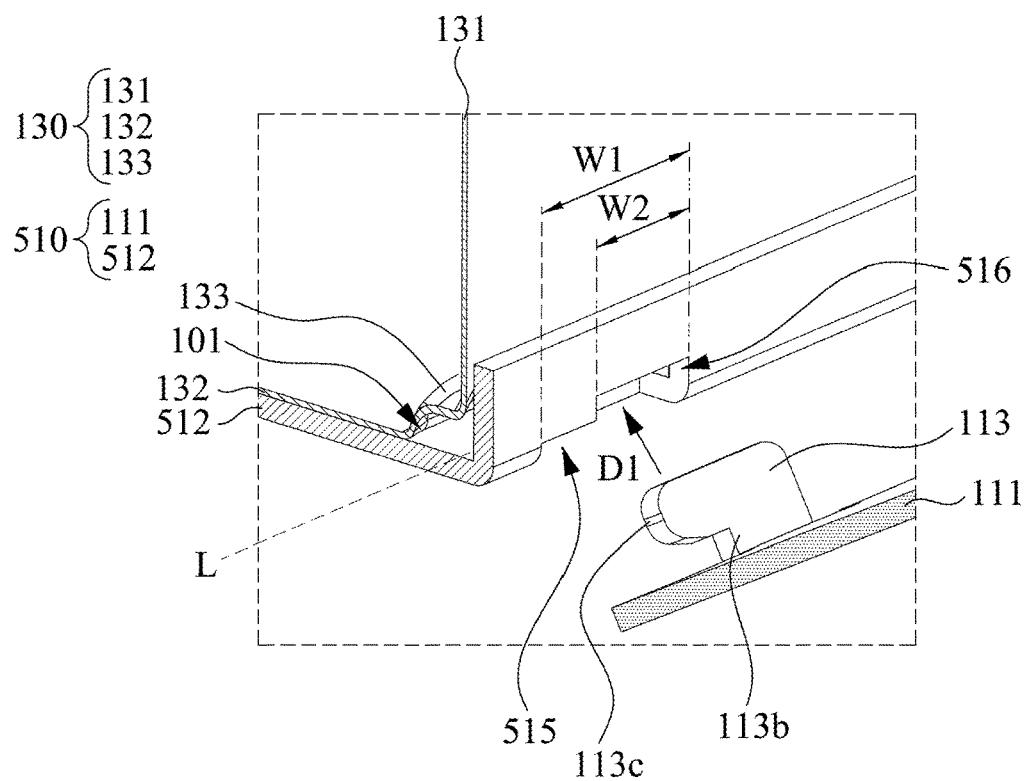

Reference is made to FIGS. 5 and 6, which illustrate partially enlarged cross-sectional views of an electronic device in accordance with another embodiment of the present disclosure, before and after the housing 510 of the electronic device is assembled. In the present embodiment, the retaining slot 514 of the second housing component 512 of the housing 510 includes an insertion portion 515 and a holding portion 516 in communication with the insertion portion 515. The insertion portion 515 is greater in width than the holding portion 516. Specifically, a width W1 of the insertion portion 515 is greater than a width W2 of the holding portion 516. The hook portion 113 of the first housing component 111 is configured to enter the retaining slot 514 through the insertion portion 515 and rotate to interlock with the holding portion 516.

As shown in FIG. 6, the hook portion 113 includes a neck portion 113b and a head portion 113c connected to the neck portion 113b. The head portion 113c is greater in width than the neck portion 113b. To assemble the housing 510, one may move the first housing component 111 in a direction D1 to insert the head portion 113c of the hook portion 113 into the accommodating space 101 through the insertion portion 515 of the retaining slot 514. Next, one may rotate the first housing component 111 about an axis L, until the neck portion 113b of the hook portion 113 enters the holding portion 516 of the retaining slot 514 to fixedly connect the first housing component 111 to the second housing component 512.

Figure 7:
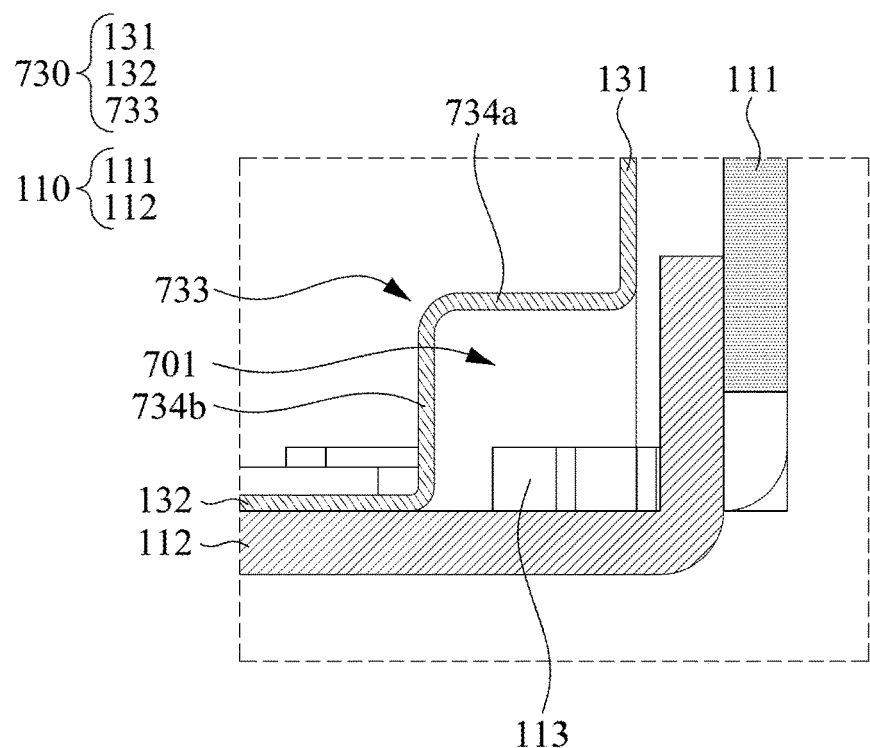
FIG. 7 illustrates a partially enlarged cross-sectional view of an electronic device in accordance with another embodiment of the present disclosure.

Reference is made to FIG. 7, which illustrates a partially enlarged cross-sectional view of an electronic device in accordance with another embodiment of the present disclosure. In the present embodiment, the concave structure 733 of the insulating piece 730 of the electronic device includes a first extending portion 734a and a second extending portion 734b. The second extending portion 734b is connected to the first extending portion 734a and is substantially perpendicular to the first extending portion 734a. The first extending portion 734a and the second extending portion 734b are connected to the first covering portion 131 and the second covering portion 132 respectively. The accommodating space 701, which is formed between the first extending portion 734a, the second extending portion 734b and the second housing component 112, has a rectangular cross-section.

Figure 8:
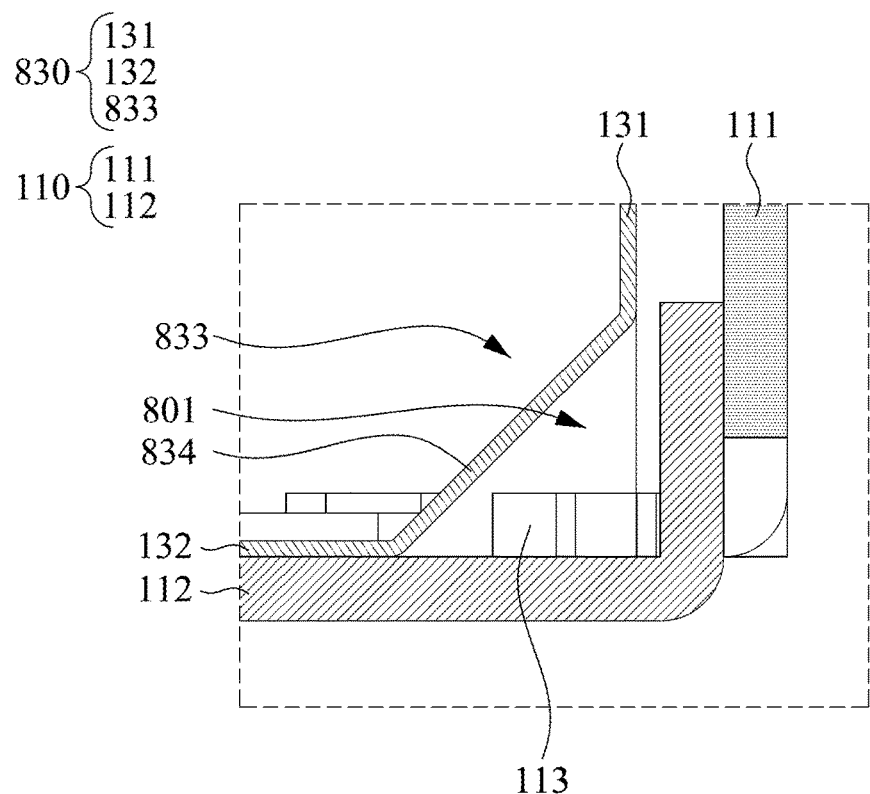
FIG. 8 illustrates a partially enlarged cross-sectional view of an electronic device in accordance with another embodiment of the present disclosure.

Reference is made to FIG. 8, which illustrates a partially enlarged cross-sectional view of an electronic device in accordance with another embodiment of the present disclosure. In the present embodiment, the concave structure 833 of the insulating piece 830 of the electronic device includes an incline 834 connected between the first covering portion 131 and the second covering portion 132. The accommodating space 801, which is formed between the incline 834 and the second housing component 112, has a triangular cross-section.

In sum, the insulating piece of the present disclosure is provided with a concave structure which forms an accommodating space with the housing to accommodate the hook portion of the housing. By this arrangement, the insulating piece may be clear of being interfered by the hook portion when assembling the housing, and can thus remain intact.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. An insulating piece for an electronic device, the electronic device comprising a first housing component and a second housing component, the first housing component comprising at least one hook portion, the hook portion being connected to the second housing component, the insulating piece comprising:
    a first covering portion;
    a second covering portion, wherein the first covering portion and the second covering portion extend in different directions; and
    at least one concave structure connected between the first covering portion and the second covering portion, wherein the concave structure and the second housing component form an accommodating space therebetween to accommodate the hook portion, and wherein the first covering portion and the second covering portion cover inner sides of the first housing component and the second housing component respectively.

2. The insulating piece of claim 1, wherein the concave structure comprises an arc connected between the first covering portion and the second covering portion.

3. The insulating piece of claim 2, wherein the arc has a radius of curvature substantially matching a length by which the hook portion extends into the accommodating space.

4. The insulating piece of claim 1, wherein the at least one concave structure and the at least one hook portion are both plural in number, the concave structures are spaced apart from one another and are positioned correspondent to the hook portions, the first covering portion joins the second covering portion between two of the concave structures to form a corner structure.

5. The insulating piece of claim 1, wherein the concave structure has two opposite ends, both of which are rounded.

6. The insulating piece of claim 1, wherein the second housing component has at least one retaining slot, the hook portion slidably engages the retaining slot, the hook portion has a cutout configured to interlock with an end of the retaining slot, and the concave structure is positioned correspondent to the hook portion and the retaining slot.

7. The insulating piece of claim 1, wherein the second housing component has at least one retaining slot, the retaining slot comprises an insertion portion and a holding portion in communication with the insertion portion, the insertion portion is greater in width than the holding portion, the hook portion is configured to enter the retaining slot through the insertion portion and rotate to interlock with the holding portion, and the concave structure is positioned correspondent to the hook portion and the retaining slot.

8. The insulating piece of claim 1, wherein the concave structure comprises a first extending portion and a second extending portion, the second extending portion is connected to the first extending portion and is substantially perpendicular to the first extending portion.

9. The insulating piece of claim 1, wherein the concave structure comprises an incline connected between the first covering portion and the second covering portion.

10. An electronic device, comprising:
    an insulating piece comprising a concave structure, a first covering portion and a second covering portion, wherein the first covering portion and the second covering portion extend in different directions, and wherein the concave structure is connected between the first covering portion and the second covering portion;
    a first housing component comprising a hook portion; and
    a second housing component having a retaining slot for receiving the hook portion, wherein the first covering portion and the second covering portion cover inner sides of the first housing component and the second housing component respectively, and the concave structure and the second housing component form an accommodating space therebetween to accommodate the hook portion.

\* \* \* \* \*